US011183662B1

(12) United States Patent
Miao

(10) Patent No.: US 11,183,662 B1
(45) Date of Patent: Nov. 23, 2021

(54) DISPLAY PANEL AND MANUFACTURING METHOD THEREOF

(71) Applicant: TCL CHINA STAR OPTOELECTRONICS TECHNOLOGY CO., LTD., Shenzhen (CN)

(72) Inventor: Jie Miao, Shenzhen (CN)

( * ) Notice: Subject to any disclaimer, the term of this patent is extended or adjusted under 35 U.S.C. 154(b) by 223 days.

(21) Appl. No.: 16/619,467

(22) PCT Filed: Nov. 13, 2019

(86) PCT No.: PCT/CN2019/117780
§ 371 (c)(1),
(2) Date: Dec. 5, 2019

(87) PCT Pub. No.: WO2021/031402
PCT Pub. Date: Feb. 25, 2021

(30) Foreign Application Priority Data

Aug. 20, 2019 (CN) .......................... 201910766720.1

(51) Int. Cl.
G02F 1/1335 (2006.01)
H01L 51/52 (2006.01)
H01L 27/32 (2006.01)
H01L 51/56 (2006.01)
G02F 1/1339 (2006.01)

(52) U.S. Cl.
CPC ........ H01L 51/5246 (2013.01); G02F 1/1339 (2013.01); G02F 1/133514 (2013.01); H01L 27/322 (2013.01); H01L 27/3276 (2013.01); H01L 51/56 (2013.01); H01L 2227/323 (2013.01)

(58) Field of Classification Search
CPC ................................................. G02F 1/133514
See application file for complete search history.

(56) References Cited

U.S. PATENT DOCUMENTS

| 2007/0286973 | A1* | 12/2007 | Sawai ....................... C03C 3/21 428/34.4 |
| 2014/0098320 | A1 | 4/2014 | Zhang et al. |
| 2015/0092142 | A1 | 4/2015 | Zhang et al. |
| 2016/0349921 | A1* | 12/2016 | Mizuhashi .......... G06F 3/03545 |
| 2018/0045997 | A1 | 2/2018 | Yamaguchi et al. |
| 2019/0064608 | A1 | 2/2019 | Shiina |

FOREIGN PATENT DOCUMENTS

| CN | 101414066 A | 4/2009 |
| CN | 101546069 A | 9/2009 |
| CN | 101706631 A | 5/2010 |
| CN | 102033363 A | 4/2011 |

(Continued)

Primary Examiner — Edmond C Lau

(57) ABSTRACT

A display panel and a manufacturing method thereof, including an array substrate, a clock metal wire for transmitting a signal, wherein material of the clock metal wire includes a microcrystalline metallic glass, a sealant, and a color filter substrate, so as to reduce the interference of water vapor components in the sealant at the via position of the clock metal wire, and reduce the probability of corrosion of the clock metal wire to improve the display defects caused by the corrosion of the clock metal wire, and to facilitate the effect of a more delicate and fine coating process.

20 Claims, 2 Drawing Sheets

(56) References Cited

FOREIGN PATENT DOCUMENTS

| | | |
|---|---|---|
| CN | 102902095 A | 1/2013 |
| CN | 106882924 A | 6/2017 |
| CN | 108863085 A | 11/2018 |
| CN | 109375442 A | 2/2019 |
| CN | 109407434 A | 3/2019 |
| CN | 110097998 A | 8/2019 |
| CN | 110109287 A | 8/2019 |
| JP | 2018146923 A | 9/2018 |

* cited by examiner

DISPLAY PANEL AND MANUFACTURING METHOD THEREOF

FIELD OF INVENTION

The present disclosure relates to the field of display technologies, and more particularly to a display panel and manufacturing method thereof.

BACKGROUND OF INVENTION

Liquid crystal displays are widely used flat panel displays, which mainly implement screen display by modulating intensity of a backlight light field through a liquid crystal switch. In manufacturing, the array substrate and the color filter substrate often need to be bonded by a sealant.

Because the sealant contains a certain amount of water vapor component, the position of the sealant on the conventional liquid crystal display has a risk of being easily corroded, which tends to cause display defects.

Therefore, there is need to provide a display panel and manufacturing method thereof to solve the problems of the prior art.

SUMMARY OF INVENTION

In order to solve the above problems, the present disclosure provides a display panel and manufacturing method thereof, so as to reduce the interference of water vapor components in the sealant, and reduce the probability of corrosion to improve the display defects of the clock metal wire, at the same time the clock metal wire is ductile to achieve a more delicate and fine coating process.

In order to achieve the above object, the present disclosure provides a display panel including an array substrate; a clock metal wire for transmitting a signal, the clock metal wire disposed on the array substrate, and material of the clock metal wire includes a microcrystalline metal glass; a sealant coated over the array substrate; and a color filter substrate disposed on the array substrate, wherein the color filter substrate and the array substrate are bonded by the sealant.

In an embodiment of the present disclosure, the sealant is further coated on a portion of the clock metal wire.

In an embodiment of the disclosure, the sealant is further coated on a portion of the clock metal wire.

In an embodiment of the present disclosure, the sealant is further coated on the clock metal wire.

In an embodiment of the present disclosure, the array substrate includes a via hole structure, and the clock metal wire passes through the via hole structure.

In an embodiment of the present disclosure, the sealant is further coated on the clock metal wire and the via hole structure.

In an embodiment of the present disclosure, between the coating range of the sealant and an edge of the array substrate further comprises an edge distance.

In an embodiment of the present disclosure, a ratio of the metallic glass to a metal in the microcrystalline metallic glass is between 5% and 95%.

In an embodiment of the present disclosure, a ratio of the metallic glass to a metal in the microcrystalline metallic glass is between 20% and 60%.

In an embodiment of the present disclosure, a ratio of the metallic glass to a metal in the microcrystalline metallic glass is between 30% and 50%.

To achieve the above objective, the present disclosure further provides a display panel, the display panel including: an array substrate; a clock metal wire for transmitting a signal, wherein the clock metal wire is disposed on the array substrate, and material of the clock metal wire comprises a microcrystalline metallic glass, a ratio of the metallic glass to the metal in the microcrystalline metallic glass is between 5% and 95%; a sealant coated over the array substrate and a portion of the clock metal wire; and a color filter substrate disposed above the array substrate, wherein the color filter substrate and the array substrate are bonded by the sealant.

In order to achieve the above object, the present disclosure further provides a method of manufacturing a display panel, comprising: forming an array substrate; forming a clock metal wire on the array substrate, and material of the clock metal wire comprises a microcrystalline metallic glass; forming a sealant on the array substrate; and forming a color filter substrate disposed on the array substrate, wherein the color filter substrate and the array substrate are bonded by the sealant.

In an embodiment of the present disclosure, wherein in the process of forming the sealant on the array substrate, a coating area of the sealant further comprises a portion of the clock metal wire.

In an embodiment of the present disclosure, wherein in the process of forming the sealant on the array substrate, a coating area of the sealant further comprises the metal wire.

In an embodiment of the present disclosure, the array substrate comprises a via hole structure, in the process of forming the clock metal wire on the array substrate, and material of the clock metal wire comprises the microcrystalline metallic glass, the clock metal wire passes through the via hole structure.

In an embodiment of the present disclosure, wherein in the process of forming the sealant on the array substrate, the sealant is also coated over the clock metal wire and the via hole structure.

In an embodiment of the present disclosure, the array substrate comprises a via hole structure, in the process of forming the clock metal wire on the array substrate, and material of the clock metal wire comprises the microcrystalline metallic glass, the clock metal wire passes through the via hole structure to connect corresponding gate line.

In an embodiment of the present disclosure, before forming the sealant on the array substrate, further according to the size of the array substrate, the size and material of the clock metal wire, and the size of the via hole structure to determine a coating range of the sealant and an edge distance between the sealant and an edge of the array substrate.

In an embodiment of the present disclosure, before forming the sealant on the array substrate, further according to the size of the array substrate, the size and material of the clock metal wire, and the size of the via hole structure to determine a coating range of the sealant and an edge distance between the sealant and an edge of the array substrate.

In an embodiment of the present disclosure, a ratio of the metallic glass to the metal in the microcrystalline metallic glass is between 5% and 95%.

In an embodiment of the present disclosure, a ratio of the metallic glass to the metal in the microcrystalline metallic glass is between 20% and 60%.

In an embodiment of the present disclosure, a ratio of the metallic glass to the metal in the microcrystalline metallic glass is between 30% and 50%.

In order to make the above description of the present disclosure more comprehensible, the preferred embodiments are described below, and in conjunction with the figures, the detailed description is as follows:

Compared with the prior art, the display panel and the manufacturing method thereof provided by the present disclosure includes an array substrate, a clock metal wire for transmitting a signal, wherein material of the clock metal wire includes a microcrystalline metallic glass, a sealant coated over the array substrate, and a color filter substrate disposed on the array substrate, wherein the color filter substrate and the array substrate are bonded by the sealant, so as to reduce the interference of water vapor components in the sealant, and reduce the probability of corrosion to improve the display defects of the clock metal wire, at the same time the clock metal wire is ductile to achieve a more delicate and fine coating process.

DETAILED DESCRIPTION OF PREFERRED EMBODIMENTS

Figure 1:
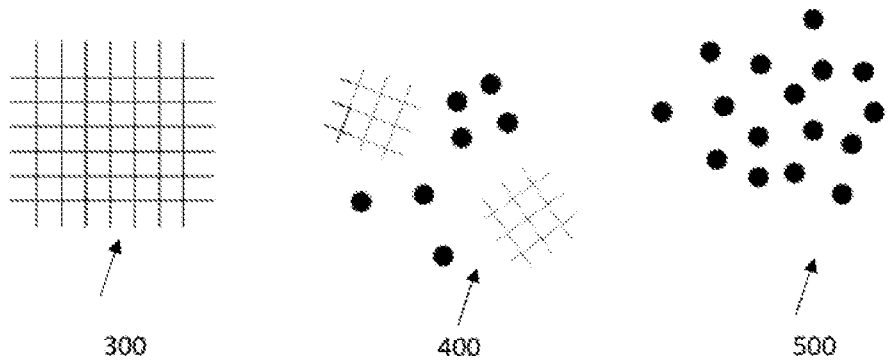
FIG. 1 is a schematic view of a microcrystalline metallic glass material according to an embodiment of the present disclosure.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

In order to achieve the above object, the present disclosure provides a display panel including an array substrate; a clock metal wire for transmitting a signal, wherein the clock metal wire is disposed on the array substrate, and material of the clock metal wire includes a microcrystalline metal glass; a sealant coated over the array substrate; and a color filter substrate disposed on the array substrate, wherein the color filter substrate and the array substrate are bonded the sealant.

Please refer to FIG. 1. FIG. 1 is a schematic view of a microcrystalline metallic glass material according to an embodiment of the present disclosure. FIG. 1 is a schematic view showing the structure of a metal 300, a microcrystalline metallic glass 400, and a metallic glass 500, respectively. As shown in FIG. 1, material of the microcrystalline metallic glass 400 includes the metal 300 and the metallic glass 500.

Further, the composition ratio of the metal 300 and the metallic glass 500 in the microcrystalline metallic glass 400 constituting the clock metal wire in the present disclosure can be adjusted according to the applicable field of the clock metal wire. For example, increasing the proportion of metal 300 in the microcrystalline metallic glass 400 in the clock metal wire increases the ductility and conductivity of the clock metal wire. Increasing the proportion of the metallic glass 500 in the microcrystalline metallic glass 400 in the clock metal wire increases the corrosion resistance of the clocked metal wire.

In an embodiment of the present disclosure, for the microcrystalline metallic glass 400 of the clock metal wire, a ratio of the metallic glass 500 to the metal 300 in the microcrystalline metallic glass 400 is between 5% and 95%.

In an embodiment of the present disclosure, a ratio of the metallic glass 500 to the metal 300 in the microcrystalline metallic glass 400 inside the clock metal wire is between 20% and 60%, thereby improving the corrosion resistance and the ductility of the clock metal wire.

In an embodiment of the present disclosure, a ratio of the metallic glass 500 to the metal 300 in the microcrystalline metallic glass 400 inside the clock metal wire is between 30% and 50%, thereby further improving the corrosion resistance of the clock metal wire.

In other words, by providing the microcrystalline metallic glass 400 in the constituent material of the clock metal wire, increase the corrosion resistance while providing a low resistivity of the clock metal wire, making the clock metal wire has good signal transmission, at the same time the clock metal wire is ductile to achieve a more delicate and fine coating process.

In an embodiment of the present disclosure, the array substrate includes a via hole structure, and the clock metal wire is connected to other lines through the via hole structure for signal transmission without affecting the overall thickness of the array substrate, further simplified the wiring arrangement of the clock metal wire.

In an embodiment of the present disclosure, the array substrate includes a via hole structure, and the clock metal wire is connected to the corresponding gate line through the via hole structure for signal transmission, without further affecting the overall thickness of the array substrate, further simplified the arrangement of the clock metal wire.

In an embodiment of the present disclosure, the sealant is further coated on the clock metal wire and the via hole structure, by directly coating the sealant on the clock metal wire and the via hole structure, increasing a contact area between the array substrate and the color filter substrate, enhancing the bonding effect between the array substrate and the color filter substrate.

In an embodiment of the present disclosure, the sealant is further coated on a portion of the clock metal wire, by coating the sealant on a portion of the clock metal wire, increasing a contact area between the array substrate and the color filter substrate, enhancing the bonding effect between the array substrate and the color filter substrate.

In an embodiment of the present disclosure, the sealant is further coated on the clock metal wire, by coating the sealant on the clock metal wire, increasing a contact area between the array substrate and the color filter substrate, enhancing the bonding effect between the array substrate and the color filter substrate.

In an embodiment of the present disclosure, the coating region of the sealant has an edge distance from the edge of the array substrate of the OLED display device, by preserving the edge distance in advance, increasing the adhesion between the array substrate and the color filter substrate, and reducing the probability that the sealant overflows the joint between the array substrate and the color filter substrate, after the array substrate is bonded to the color filter substrate.

Figure 2:
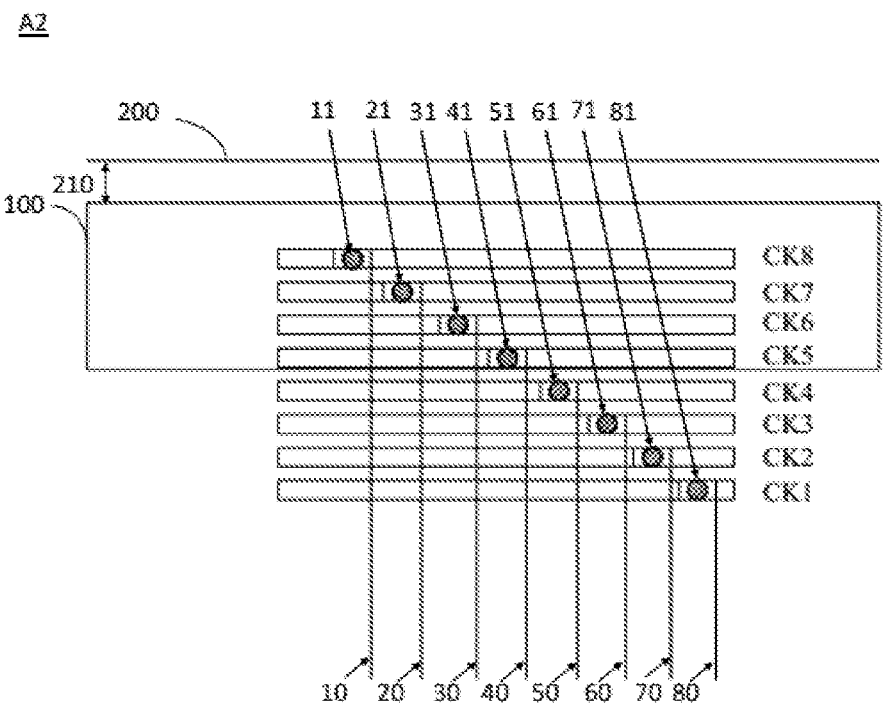
FIG. 2 is a schematic diagram showing the layout of an array substrate of an organic light emitting diode display device according to an embodiment of the present disclosure.

Please refer to FIG. 2. FIG. 2 is a schematic diagram showing the layout of an array substrate of an organic light emitting diode display device according to an embodiment of the present disclosure. The array substrate A2 of the OLED display device includes: a first clock bus line CK1, a first clock metal wire 10 connected to the first clock bus line CK1, and a first via hole structure 11 disposed on the first clock bus line CK1, the first clock metal wire 10 pass through the first via hole structure 11; a second clock bus line CK2, a second clock metal wire 20 connected to the second clock bus line CK2, and a second via hole structure 21 disposed on the second clock bus line CK2, the second clock metal wire 20 pass through the second via hole structure 21; a third clock bus line CK3, a third clock metal wire 30 connected to the third clock bus line CK3, and a third via hole structure 31 disposed on the third clock bus line CK3, the third clock metal wire 30 pass through the third via hole structure 31; a fourth clock bus line CK4, a fourth clock metal wire 40 connected to the fourth clock bus line CK4, and a fourth via hole structure 41 disposed on the fourth clock bus line CK4, the fourth clock metal wire 40 pass through the fourth via hole structure 41; a fifth clock bus line CK5, a fifth clock metal wire 50 connected to the fifth clock bus line CK5, and a fifth via hole structure 51 disposed on the fifth clock bus line CK5, the fifth clock metal wire 50 pass through the fifth via hole structure 51; a sixth clock bus line CK6, a sixth clock metal wire 60 connected to the sixth clock bus line CK6, and a sixth via hole structure 61 disposed on the sixth clock bus line CK6, the sixth clock metal wire 60 pass through the sixth via hole structure 61; a seventh clock bus line CK7, a seventh clock metal wire 70 connected to the seventh clock bus line CK7, and a seventh via hole structure 71 disposed on the seventh clock bus line CK7, the seventh clock metal wire 70 pass through the seventh via hole structure 71; an eighth clock bus line CK8, a eighth clock metal wire 80 connected to the eighth clock bus line CK8, and a eighth via hole structure 81 disposed on the eighth clock bus line CK8, the eighth clock metal wire 80 pass through the eighth via hole structure 81.

The coating range 100 of the sealant and the edge 200 of the array substrate of the OLED display device are separated by an edge distance 210, by reserving the edge distance 210 in advance, reducing the probability that the sealant overflows the joint surface of the array substrate A2 and the color filter substrate. After the array substrate A2 and the color filter substrate are bonded, optimizing the coated frame coating position, reducing the production cost of the organic light emitting diode display device.

In an embodiment of the present disclosure, the sealant is further coated on a portion of the clock metal wire. Taking the embodiment disclosed in FIG. 2 as an example, a portion of the first clock metal wire 10, a portion of the second clock metal wire 20, a portion of the third clock metal wire 30, and a portion of the fourth clock metal wire 40 are disposed within the coating range 100 of the sealant.

However, the disclosure is not limited thereto. In an embodiment of the present disclosure, the array substrate, the clock metal wire, and the via hole structure are coated with a sealant; in other words, the sealant is simultaneously coated on the array substrate, the clock metal wire, and the via hole structure to enhance an adhesion with other adhesion components.

Figure 3:
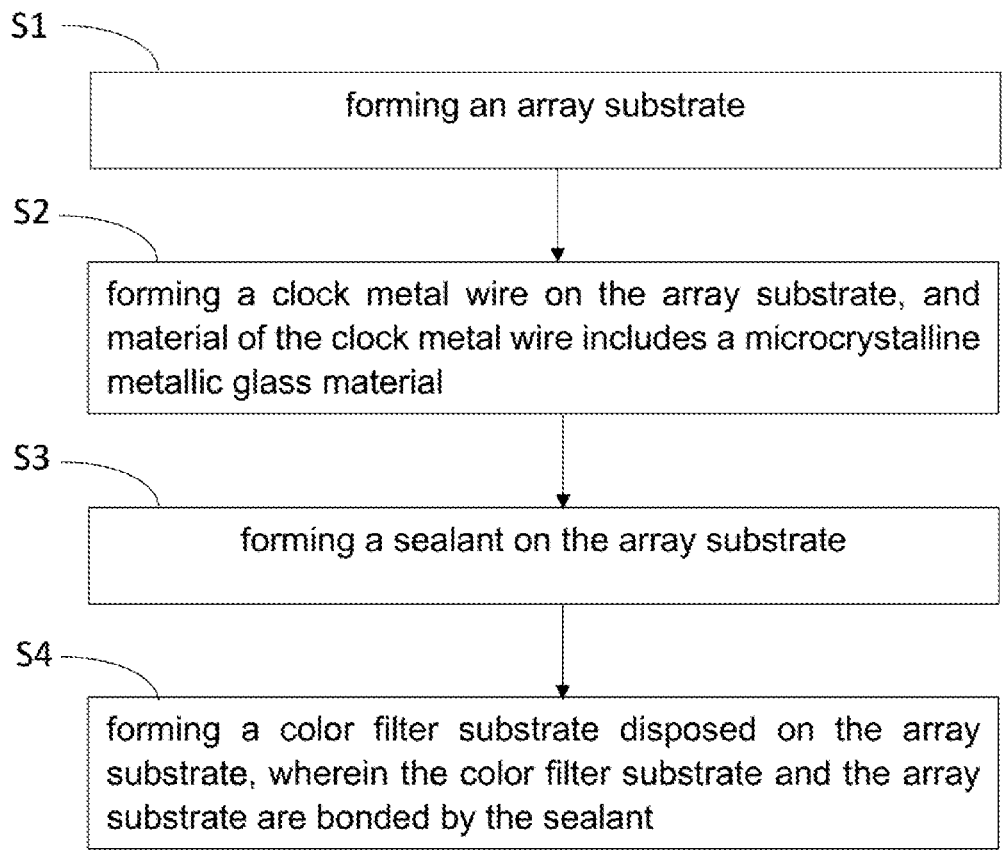
FIG. 3 is a flowchart showing a method of manufacturing the display panel according to an embodiment of the present disclosure.

Please refer to FIG. 3. FIG. 3 is a flowchart showing a method of manufacturing the display panel according to an embodiment of the present disclosure. To achieve the above object, the present disclosure further provides a method for manufacturing a display panel, including:

Process S1: forming an array substrate;

Process S2: forming a clock metal wire on the array substrate, and material of the clock metal wire includes a microcrystalline metallic glass material;

Process S3: forming a sealant on the array substrate; and

Process S4: forming a color filter substrate disposed on the array substrate, wherein the color filter substrate and the array substrate are bonded by the sealant.

In an embodiment of the present disclosure, wherein in the process S3 of forming the sealant on the array substrate, a coating area of the sealant further includes a portion of the clock metal wire. By coating a sealant on a portion of the clock metal wire, increasing the contact area of the sealant between the array substrate and the color filter substrate, and enhancing the adhesion between the array substrate and the color filter substrate.

In an embodiment of the present disclosure, the array substrate is provided with a via hole structure, and the clock metal wire passes through the via hole structure, and in the process S2 of forming the clock metal wire on the array substrate, and material of the clock metal wire comprises the microcrystalline metallic glass, the clock metal wire passes through the via hole structure. By the arrangement of the via hole structure, the clock metal wire is connected to the corresponding gate line through the via hole structure for signal transmission, which does not affect the overall thickness of the array substrate, and simplifies the arrangement of the clock metal wire.

In an embodiment of the present disclosure, in the process S3 of forming the sealant on the array substrate, the sealant is also coated over the clock metal wire and the via hole structure, the coated region of the sealant further includes a clock metal wire and a via hole structure. By applying a sealant on the clock metal wire and the via hole structure, increasing the contact area of the sealant between the array substrate and the color filter substrate, and enhancing the adhesion between the array substrate and the color filter substrate.

In an embodiment of the present disclosure, before the process S3 of forming a sealant on the array substrate, further according to the size of the array substrate, the size and material of the clock metal wire, and the size of the via hole structure to determine a coating range of the sealant and an edge distance between the sealant and an edge of the array substrate. by preserving the spaced edge distance in advance, reducing the probability that the sealant overflows the joint between the array substrate and the color filter substrate, after the array substrate is bonded to the color filter substrate, optimizing the coated frame coating position, reducing the production cost of the organic light emitting diode display device.

The display panel and the manufacturing method thereof provided by the present disclosure includes an array substrate, a clock metal wire for transmitting a signal, wherein material of the clock metal wire includes a microcrystalline metallic glass, a sealant coated over the array substrate, and a color filter substrate disposed on the array substrate, wherein the color filter substrate and the array substrate are bonded by the sealant, so as to reduce the interference of water vapor components in the sealant, and reduce the probability of corrosion to improve the display defects of the clock metal wire, at the same time the clock metal wire is ductile to achieve a more delicate and fine coating process.

The above description is only a preferred embodiment of the present disclosure, and it should be noted that those skilled in the art can also make several improvements and refinements without departing from the principles of the present disclosure. These improvements and refinements should also be considered as in the protected scope of present disclosure.

What is claimed is:

1. A display panel, comprising:
an array substrate;
a clock metal wire for transmitting a signal, wherein the clock metal wire is disposed on the array substrate, and material of the clock metal wire comprises a microcrystalline metallic glass;
a sealant coated over the array substrate; and
a color filter substrate disposed on the array substrate, wherein the color filter substrate and the array substrate are bonded by the sealant.

2. The display panel as claimed in claim 1, wherein the sealant is further coated on a portion of the clock metal wire.

3. The display panel as claimed in claim 1, wherein the sealant is further coated on the clock metal wire.

4. The display panel as claimed in claim 1, wherein the array substrate comprises a via hole structure, and the clock metal wire passes through the via hole structure.

5. The display panel as claimed in claim 4, wherein the sealant is further coated on the clock metal wire and the via hole structure.

6. The display panel as claimed in claim 1, wherein between a coating range of the sealant and an edge of the array substrate further comprises an edge distance.

7. The display panel as claimed in claim 1, wherein a ratio of the metallic glass to a metal in the microcrystalline metallic glass is between 5% and 95%.

8. The display panel as claimed in claim 1, wherein a ratio of the metallic glass to a metal in the microcrystalline metallic glass is between 20% and 60%.

9. The display panel as claimed in claim 1, wherein a ratio of the metallic glass to a metal in the microcrystalline metallic glass is between 30% and 50%.

10. A display panel, comprising:
an array substrate;
a clock metal wire for transmitting a signal, wherein the clock metal wire is disposed on the array substrate, and material of the clock metal wire comprises a microcrystalline metallic glass, a ratio of the metallic glass to the metal in the microcrystalline metallic glass is between 5% and 95%;
a sealant coated over the array substrate and a portion of the clock metal wire; and
a color filter substrate disposed above the array substrate, wherein the color filter substrate and the array substrate are bonded by the sealant.

11. A method of manufacturing a display panel, comprising:
forming an array substrate;
forming a clock metal wire on the array substrate, and material of the clock metal wire comprises a microcrystalline metallic glass;
forming a sealant on the array substrate; and
forming a color filter substrate disposed on the array substrate, wherein the color filter substrate and the array substrate are bonded by the sealant.

12. The method of manufacturing the display panel as claimed in claim 11, wherein in the process of forming the sealant on the array substrate, a coating area of the sealant further comprises a portion of the clock metal wire.

13. The method of manufacturing the display panel as claimed in claim 11, wherein in the process of forming the sealant on the array substrate, a coating area of the sealant further comprises the metal wire.

14. The method of manufacturing the display panel as claimed in claim 11, wherein the array substrate comprises a via hole structure, in the process of forming the clock metal wire on the array substrate, and material of the clock metal wire comprises the microcrystalline metallic glass, the clock metal wire passes through the via hole structure.

15. The method of manufacturing the display panel as claimed in claim 14, wherein in the process of forming the sealant on the array substrate, the sealant is also coated over the clock metal wire and the via hole structure.

16. The method of manufacturing the display panel as claimed in claim 11, wherein the array substrate comprises a via hole structure, in the process of forming the clock metal wire on the array substrate, and material of the clock metal wire comprises the microcrystalline metallic glass, the clock metal wire passes through the via hole structure to connect corresponding gate line.

17. The method of manufacturing the display panel as claimed in claim 15, wherein before forming the sealant on the array substrate, further according to the size of the array substrate, the size and material of the clock metal wire, and the size of the via hole structure to determine a coating range of the sealant and an edge distance between the sealant and an edge of the array substrate.

18. The method of manufacturing the display panel as claimed in claim 11, wherein a ratio of the metallic glass to the metal in the microcrystalline metallic glass is between 5% and 95%.

19. The method of manufacturing the display panel as claimed in claim 11, wherein a ratio of the metallic glass to the metal in the microcrystalline metallic glass is between 20% and 60%.

20. The method of manufacturing the display panel as claimed in claim 11, wherein a ratio of the metallic glass to the metal in the microcrystalline metallic glass is between 30% and 50%.

* * * * *